United States Patent [19]
Petropoulos et al.

[11] Patent Number: 5,942,898
[45] Date of Patent: Aug. 24, 1999

[54] THRUST BALANCED BI-PLANAR GRADIENT SET FOR MRI SCANNERS

[75] Inventors: Labros S. Petropoulos, Solon; Michael A. Morich, Mentor, both of Ohio

[73] Assignee: Picker International, Inc., Highland Heights, Ohio

[21] Appl. No.: 08/988,045

[22] Filed: Dec. 10, 1997

Related U.S. Application Data

[60] Provisional application No. 60/033,076, Dec. 13, 1996.

[51] Int. Cl.⁶ .................................................. G01V 3/00
[52] U.S. Cl. .......................................... 324/318; 324/320
[58] Field of Search .................................. 324/318, 319, 324/320, 322, 300, 307, 309; 335/296, 299

[56] References Cited

U.S. PATENT DOCUMENTS

| | | | |
|---|---|---|---|
| 5,036,282 | 7/1991 | Morich et al. | 324/318 |
| 5,315,276 | 5/1994 | Huson et al. | 324/319 |
| 5,545,996 | 8/1996 | Morich et al. | 324/318 |
| 5,764,059 | 6/1998 | Mansfield et al. | 324/318 |
| 5,774,034 | 6/1998 | Yoneda et al. | 324/320 |

OTHER PUBLICATIONS

"Biplanar Gradient Coil for Interventional Open–Concept Superconducting Magnet," Atila Ersahin, R. Scott Hinks, Michael J. Bronskill and R. Mark Henkelman, Society of Magnetic Resonance Third Scientific Meeting.

"Actively Shielded Biplanar Gradient Set for Open Magnet Geometries with Vertically Directed Fields," L.S. Petropoulos, Aug. 19–25, 1995, Society of Magnetic Resonance Third Scientific Meeting.

*Primary Examiner*—Louis Arana
*Attorney, Agent, or Firm*—Fay, Sharpe, Beall, Fagan, Minnich & McKee

[57] ABSTRACT

A magnetic resonance imaging apparatus has a main magnet (20) having opposite first and second poles (22, 24) arranged facing one another to define a subject receiving region (14) therebetween. The main magnet (20) generates a main magnetic field (12) within the subject receiving region (14). The main magnetic field (12) has non-uniformities and radial components at the periphery of the subject receiving region (14). A radio frequency coil (74) is disposed about the subject receiving region (14) to transmit radio frequency signals into the subject receiving region (14) and a receiver receives radio frequency signals therefrom. A shielded thrust balanced bi-planar gradient coil assembly (50) is included. The shielded thrust balanced bi-planar gradient coil assembly (50) has at least one pair of windings for generating substantially linear magnetic gradients across the subject receiving region (14). Each pair of windings includes a first set of windings (52) and a second set of windings (54), and each set of windings includes at least a primary winding (56) and a secondary winding (58). The first and second set of windings (52, 54) are positioned on opposite sides of the subject receiving region (14) near the first and second pole pieces (22, 24). The secondary windings (58) are positioned between their respective primary windings (56) and their associated pole pieces (22, 24). The first and second set of windings (52, 54) are arranged such that the net thrust forces acting thereon generated by interaction between the main magnetic field (12) and electrical current pulses through the windings are substantially zero.

14 Claims, 13 Drawing Sheets

THRUST BALANCED BI-PLANAR GRADIENT SET FOR MRI SCANNERS

This application claims the benefit of U.S. Provisional Application No. 60/033,076, filed Dec. 13, 1996.

BACKGROUND OF THE INVENTION

The present invention relates to the art of magnetic field gradient generation. It finds particular application in conjunction with establishing gradient magnetic fields in magnetic resonance imaging techniques and will be described with particular reference thereto. It is to be appreciated, however, that the invention will also find application in spectroscopy and other processes and apparatus in which accurately predictable magnetic field gradients are established or maintained.

In magnetic resonance imaging, a uniform magnetic field is created through an examination region in which a subject to be examined is disposed. A series of radio frequency pulses and magnetic field gradients are applied to the examination region. Gradient fields are conventionally applied as a series of gradient pulses with preselected profiles.

The gradient magnetic pulses are applied to select and encode the magnetic resonance signals. In some cases, the magnetic field gradients are applied to select one or more planes or slices to be imaged. Gradient field pulses are also applied for selectively modifying the uniform magnetic field to encode frequency and phase into the magnetization, hence the resonance signals in order to identify a spatial location.

The magnetic resonance signals are then processed to generate two or three dimensional image representations of a portion of the subject in the examination region. The accuracy of the resultant image representation, among other factors, is dependent upon the accuracy with which the actually applied magnetic field gradient pulses conform to selected gradient pulse profiles.

Conventionally, the uniform main magnetic field is generated in one of two ways. The first method employs a cylindric solenoidal shaped main magnet. The central bore of the main magnet defines the examination region in which a horizontally directed main magnetic field is generated. The second method employs a main magnet having an open geometry. Typically, the main magnet has opposing poles arranged facing one another to define the examination region therebetween. The poles are connected by a ferrous flux return path. This configuration generates a substantially uniform main magnetic field within the examination region. Open geometry main magnets have been able to solve important MRI issues such as, increasing patient aperture, avoiding patient claustrophobia, and improving access for interventional MRI applications. However, the design of gradient coils for generating the magnetic field gradients differs from that of the cylindrical type main magnets having horizontally directed main magnetic fields due to the orientation of the main magnetic field in relation to the gradient coils.

In the solenoidal coil type systems, conventional gradient coils included coils wound in a bunched or distributed fashion on a large diameter hollow right cylinder tube. Conventional bunch geometries include Maxwell or modified Maxwell pair for Z-gradient production and single or multi-arc golay saddle coils for X and Y-gradient production. The coils are normally wound in a series arrangement in a position to give a magnetic field profile with the desired linearity over a predefined volume. However, the large inductances which are typically in wound cylindrical gradient coils, limit the switching speed of the gradient magnetic field.

Planar gradient magnetic field assemblies have been developed for the cylindrical main magnets with horizontally directed fields. However, this type of planar gradient magnetic field assembly would not be directly compatible with main magnets having vertically directed fields. That is to say, in main magnets with horizontally directed fields, the direction of the main magnetic field is parallel to the planar surface of the gradient coil while in main magnets with vertically directed fields, the direction of the main field is orthogonal or transverse to the planar surface of the gradient coil.

In open magnet systems, the uniformity of the main magnetic field is dependent upon the separation gap between the magnetic poles and the dimensions of the magnetic poles. Typically, the ratio of the diameter of the magnetic poles to the distance between the poles is designed to allow for the greatest possible patient access. Generally, this results in the dimensions of the magnetic poles being similar to the dimensions of the bi-planar gradient coils typically employed with main magnets having an open geometry. In this case, the main magnetic field is fairly uniform within the imaging volume. However, non-uniformities and substantially non-zero transverse components in the field arise at larger axial and transverse locations near the periphery of the subject receiving region and the magnetic poles. Interactions between the non-uniformities of the vertical main magnetic field, and transverse components of main magnetic field, and the currents of the bi-planar gradient coils generates a net thrust force acting upon the coils. Depending upon the overall uniformity and strength of the main magnetic field, the magnitude of such thrust force can exceed 2,000 Newtons. Force of such magnitude can generate vibrations and mechanical stresses on the gradient structure, which can have an impact on the safety of the MRI scanner and can cause deleterious imaging effects such as ghosting and loss of resolution. Enlarging the dimensions of the magnetic poles to allow the gradient coils to reside in a more uniform area of the main magnetic field detracts from the purpose of having a main magnet with an open geometry in that it significantly reduces patient access.

The present invention contemplates a new and improved gradient coil configuration which overcomes the above-referenced problems and others.

SUMMARY OF THE INVENTION

In accordance with one aspect of the present invention, a magnetic resonance imaging apparatus is provided. The magnetic resonance imaging apparatus includes a main magnet having opposing poles arranged facing one another to define a subject receiving region therebetween. The magnet generates a substantially uniform main magnetic field within the subject receiving region. The main magnetic field has non-uniformities and radial components at a periphery of the subject receiving region. A radio frequency coil is disposed adjacent the subject receiving region and positioned to transmit radio frequency signals into the subject receiving region and receive radio frequency signals therefrom. A shielded thrust balanced bi-planar gradient coil assembly has at least one pair of windings for generating a substantially linear magnetic gradient across the subject receiving region. Each pair of windings includes a first set of windings carrying electrical current pulses and a second set of windings carrying electrical current pulses. The first set of windings has at least a primary winding and a secondary winding positioned on one side of the subject receiving region adjacent the first pole with the secondary winding closer to the pole than the primary winding. The first set of windings is arranged such that net thrust forces generated by the interaction between the main magnetic field and the electrical current pulses acting on the first set of windings are substantially zero. The second set of windings also has at least a primary winding and a secondary winding positioned on a side of the subject receiving region opposite the first set of windings adjacent the second pole with the secondary winding closer to the second pole than the primary winding. As well, the second set of windings are arranged such that net thrust forces generated by the interaction between the main magnetic field and the electrical pulses acting on the second set of windings are substantially zero.

In accordance with a more limited aspect of the present invention, the magnetic resonance imaging apparatus has a current supply for supplying the electrical current pulses to the windings. The magnetic resonance imaging apparatus also includes a radio frequency transmitter and receiver for supplying and receiving respectively radio frequency signals from the radio frequency coil. The magnetic resonance imaging apparatus has a reconstruction processor for reconstructing an image representation from the signals received by the radio frequency receiver and a human viewable display for the displaying the image representation.

In accordance with a more limited aspect of the present invention, the shielded thrust balanced bi-planar gradient coil assembly includes three pairs of windings, one each for generating a substantially linear magnetic gradient across the subject receiving region along three mutually orthogonal axes, x, y and z. The z axis is aligned with the vertical temporally constant magnetic field and the x and y axes are positioned in a plane transverse thereto.

In accordance with a more limited aspect of the present invention, the pair of windings for generating the substantially linear magnetic gradient along the x axis is substantially the same as the pair of windings for generating the substantially linear magnetic gradient along the y axis rotated 90° about the z axis.

In accordance with a more limited aspect of the present invention, the magnetic flux density in a region outside an area defined by the secondary windings is substantially canceled.

In accordance with a more limited aspect of the present invention, the primary windings are arranged to induce the substantially linear magnetic gradients, and the secondary windings are arranged to substantially cancel a magnetic flux density in a region outside an area defined by the secondary windings while balancing the net thrust forces acting on the sets of windings to substantially zero.

In accordance with a more limited aspect of the present invention, each set of windings also includes force balancing windings. The primary windings are arranged to induce the substantially linear magnetic gradients. The secondary windings are arranged to substantially cancel a magnet flux density in a region outside an area defined by the secondary windings. The force balancing windings are arranged to substantially zero the net thrust forces acting on the sets of windings.

In accordance with a more limited aspect of the present invention, an absolute value of the net thrust forces acting on the sets of windings is less than 20 Newtons.

In accordance with a more limited aspect of the present invention, the poles are connected by a ferrous flux return path.

In accordance with another aspect of the present invention, a method of producing a magnetic resonance image is provided. The method includes arranging two opposite poles of a main magnet facing one another to define an examination region therebetween. A substantially uniform main magnetic field is generated in the examination region. The temporally constant magnetic field has non-uniformities and radial components at a periphery of the examination region. Substantially linear magnetic gradients are generated across the examination region by applying electrical current pulses to primary windings positioned on opposite sides of the examination region by the poles of the main magnet. Electrical current pulses are applied to secondary windings positioned outside the primary windings adjacent the poles of the main magnet to thereby substantially cancel magnet flux density outside a region defined by the secondary windings while balancing to zero a net thrust force acting on each pair of primary and secondary windings. The net thrust force being generated by the interaction between the main magent's magnetic field and the applied electrical current pulses.

In accordance with another aspect of the present invention, a gradient coil assembly is provided for use in a magnetic resonance imaging apparatus. The magnetic resonance imaging apparatus includes an open magnet with opposite first and second poles arranged facing one another to define a subject receiving region therebetween. The open magnet generates a main magnetic field within the subject receiving region. The main magnetic field has non-uniformities and radial components at a periphery of the subject receiving region. The magnetic resonance imaging apparatus also includes a gradient coil assembly for generating substantially linear magnetic gradients across the subject receiving region, a current supply for selectively supplying electrical current pulses to the gradient coil assembly, a radio frequency coil disposed about the subject receiving region positioned to transmit radio frequency signals into the subject receiving region and receiving radio frequency signals therefrom, a transmitter for supplying radio frequency signals to the radio frequency coil, a receiver for receiving radio frequency signals via the radio frequency coil, and a reconstruction processor for reconstructing an image representation from the signals received by the radio frequency receiver to display on a human viewable display. The gradient coil assembly has at least one shielded thrust balanced bi-planar gradient coil. The shielded thrust balanced bi-planar gradient coil has a first set of windings with at least a primary winding and a secondary winding position on one side of the subject receiving region adjacent the first pole. The secondary winding being closer to the first pole than the primary winding. The first set of windings are arranged such that the net thrust forces acting thereupon generated by the interaction between the main magnetic field and the electrical current pulses are substantially zero. The shielded thrust balanced bi-planar gradient coil also includes a second set of windings having at least a primary winding and a secondary winding positioned on the side of the subject receiving region opposite the first set of windings adjacent the second pole. The second winding is positioned closer to the second pole than the primary winding. The second set of windings is also arranged such that net thrust forces acting thereupon generated by the interaction between the main magnetic field and the current pulses are substantially zero.

In accordance with a more limited aspect of the present invention, a current density in the secondary windings is higher around a periphery of the secondary windings than toward the center of the secondary windings.

In accordance with a more limited aspect of the present invention, a periphery of the secondary windings are flared outward and a current density on the flared portion of the secondary windings balances the net thrust forces acting on each set of windings to zero.

One advantage of the present invention is that the shielded thrust balanced bi-planar gradient coil assembly relieves mechanical stresses in the gradient coil structures.

Another advantage of the present invention is the reduction of vibrations which can have deleterious imaging effects such as ghosting and loss of resolution.

Yet another advantage of the present invention is that it generates substantially linear magnetic gradients in the examination region while maintaining its shielding characteristics and zeroing net thrust forces acting on the gradient coil assembly thereby protecting the main magnet from eddy currents and vibrations or mechanical stresses.

Still further advantages of the present invention will become apparent to those of ordinary skill in the art upon reading and understanding the following detailed description of the preferred embodiments.

BRIEF DESCRIPTION OF THE DRAWINGS

The invention may take form in various parts and arrangements of parts. The drawings are only for purposes of illustrating an preferred embodiment and are not to be construed as limiting the invention.

DETAILED DESCRIPTION OF THE PREFERRED EMBODIMENT

Figure 1:
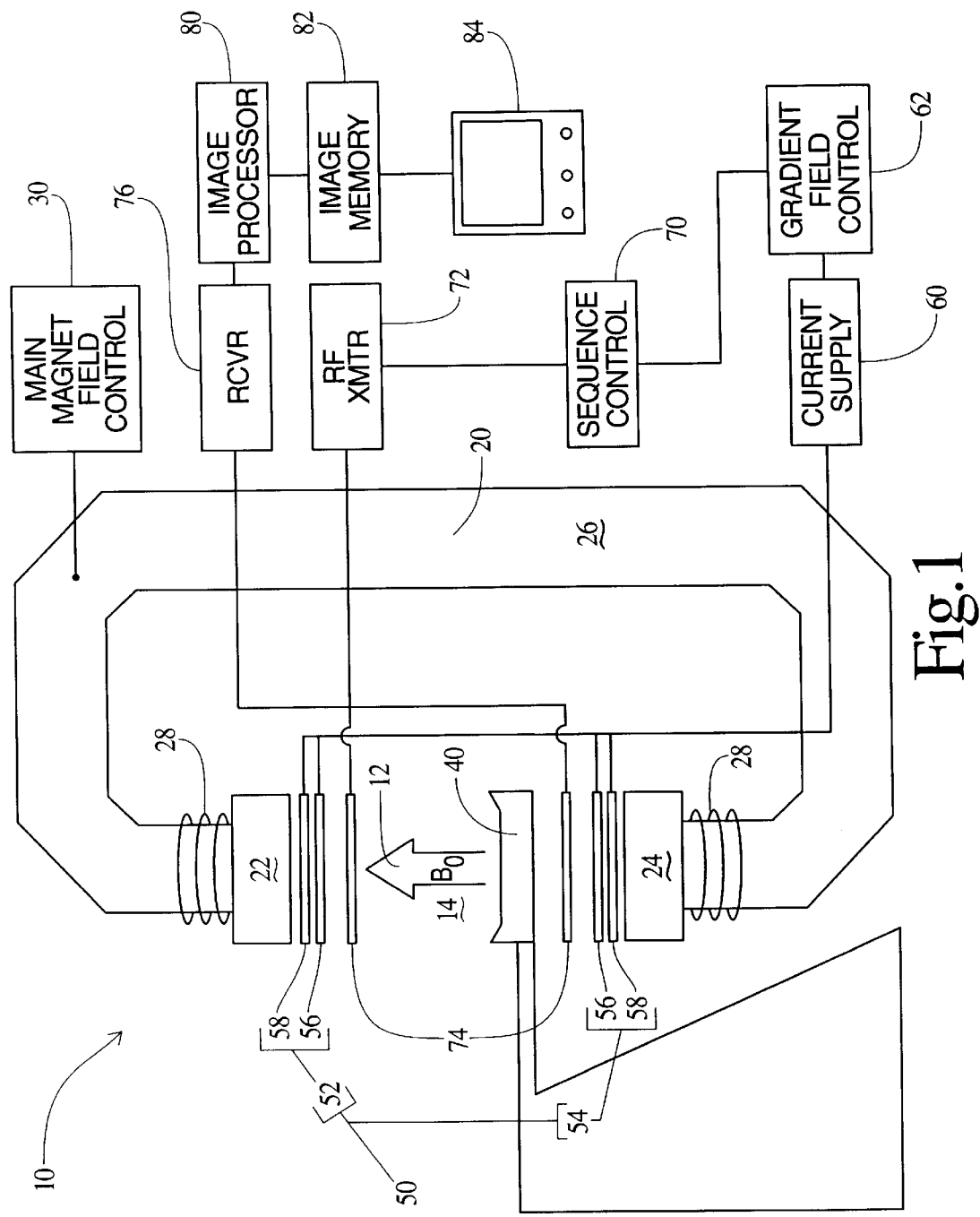
FIG. 1 is a diagrammatic illustration of a magnetic resonance imaging apparatus including a shielded thrust balanced bi-planar gradient coil assembly in accordance with the present invention.

With reference to FIG. 1, a magnetic resonance imaging apparatus 10 generates a substantially uniform magnetic field 12 through an examination region 14 which is defined by opposing magnetic pole pieces 22, 24 of the main magnet 20. Preferably, the main magnetic field 12 is a strong substantially uniform field that is aligned with a z or vertical axis. In the illustrated embodiment, the opposing magnetic pole pieces 22, 24 are connected by a ferrous flux return path 26, such as a C- or U-shaped iron element. Resistive or superconducting main field coils 28 are operated under control of a main magnetic field control circuit 30 to induce the main magnetic field 12 between the opposing magnetic pole pieces 22, 24 in the examination region 14 and a magnetic flux in the ferrous flux return path 26. Alternately, the iron element 26 may be a permanent magnet which generates the main magnetic field 12 within the examination region 14. Preferably, the main field coils 28 include coil segments disposed adjacent to or in conjunction with each of the opposing magnetic pole pieces 22, 24. However, the main field coils 28 can be disposed anywhere along the ferrous flux return path 26.

A couch 40 suspends a subject to be examined within the examination region 14. Preferably, the couch 40 is moveable so as to be selectively inserted and retracted from the examination region 14.

A shielded bi-planar thrust balanced gradient coil assembly 50 selectively creates gradient magnetic fields across the examination region 14. The shielded bi-planar thrust balanced gradient coil assembly 50 includes a Y-gradient coil assembly which applies gradients along a y axis, preferably a horizontal axis transverse to the z axis. Analogously, an X-gradient coil assembly selectively applies gradients in the x direction, preferably a horizontal direction transverse to the z axis and orthogonal to the y axis. A Z-gradient coil assembly generates a magnetic field gradient in the vertical z direction parallel to the main magnetic field 12. More specifically to the preferred embodiment, each of the X, Y, and Z-gradient coil assemblies include a first set of windings 52 and a second set of windings 54 disposed on opposite sides of a subject to be examined one each adjacent respective opposing magnetic pole pieces 22, 24. Each set of windings 52, 54 has a primary winding 56 and a secondary or shielding winding 58 wherein the secondary or shielding winding 58 is positioned between its respective primary winding 56 and the magnetic pole piece 22, 24 with which it is associated. The windings 56, 58 are made to be rigidly mechanically linked to each other.

The windings of each of the X, Y and Z-gradient coil assemblies are arranged such that in operation a substantially linear magnetic field gradient is generated in the main magnetic field 12 across the examination region 14 in their respective directions while substantially canceling magnetic flux density in a region outside an area defined by the secondary or shielding windings 58. Further, each set of windings 52, 54 is arranged such that, in operation, net thrust forces acting on the set of windings 52, 54 generated by interaction between the main magnetic field 12 and electrical current pulses applied to the windings are substantially zero.

A current supply 60 selectively applies electrical current pulses to the windings of the shielded bi-planar thrust balanced gradient coil assembly 50. A gradient field control means 62 is controlled by a sequence control processor 70 to control the current supply 60 to cause it to apply appropriate current pulses to the windings to cause selected gradient pulses.

The sequence controlled processor 70 controls a radio frequency transmitter 72 for generating radio frequency pulses of the appropriate frequency spectrum for inducing resonance in selected dipoles disposed in the examination region 14. The radio frequency transmitter 72 is connected to a radio frequency antenna 74 disposed adjacent the examination region 14 for transmitting radio frequency pulses into a region of interest of the subject to be examined.

The radio frequency antenna 74 may be disposed near the opposing magnetic pole pieces 22, 24, or on the subject to be examined. For example, a surface coil may be positioned contiguous to a subject to be examined for controllably inducing magnetic resonance in a selected region of the subject.

A magnetic resonance receiver 76 receives signals from resonating dipoles within the examination region 14. The signals are received via the same antenna 74 that transmit the radio frequency pulses. Alternately, separate receiver coils may be used. For example, receive only surface coils may be disposed continuous to a selected region of the subject to be examined to receive resonance induced therein by a radio frequency transmitting coil surrounding the examination region 14. Ultimately, the radio frequency signals received are demodulated and reconstructed into an image representation by a reconstruction processor 80. The image may represent a planar slice through the patient, an array of parallel planar slices, a three-dimensional volume, or the like. The image is then stored in an image memory 82 where it may be accessed by a display, such as a video monitor 84 which provides a human viewable display of the resultant image.

In particular, each of the windings are symmetrically arranged coil loop arrays 90 disposed on smooth surfaces, preferably planes. The smooth surfaces are non-magnetic, non-conducting material on which the conductive coil loop arrays 90 are mounted.

Previously, the design of bi-planar gradient coil assemblies for vertically directed fields was generally based on the assumption that the main magnetic field remained constant within the region that included the gradient coil assembly. This is a reasonable approximation if the dimensions of the magnetic poles, as well as their separation gap are considerably larger than the dimensions of the bi-planar gradient coil assembly. However, when maintaining sufficient patient access in open magnet systems, the dimensions of the magnetic poles are similar to the dimensions of the bi-planar gradient coil assembly. In this case, the main magnetic field, $\vec{B}_0 = B_{0z}\hat{z}$, is fairly uniform within the imaging volume, but changes drastically at larger axial ($\hat{z}$) and transverse ($\hat{x}$, $\hat{y}$) locations such as at the periphery of the subject receiving region and near the magnetic poles. The interaction between the spatially varying axial and transverse components of the main magnetic field with the current of the X, Y, and Z bi-planar gradient coils generates a net x, y, and z directed thrust force, respectively. As stated earlier, depending on the overall uniformity and strength of the main magnetic field and gradient field strength, the magnitude of such force may exceed 2000 Newtons. Forces of such magnitude generate vibrations and mechanical stresses on the gradient coil assembly, which can have an impact on the safety of the MRI scanner and can cause deleterious imaging effects such as ghosting and loss of resolution.

Figure 2:
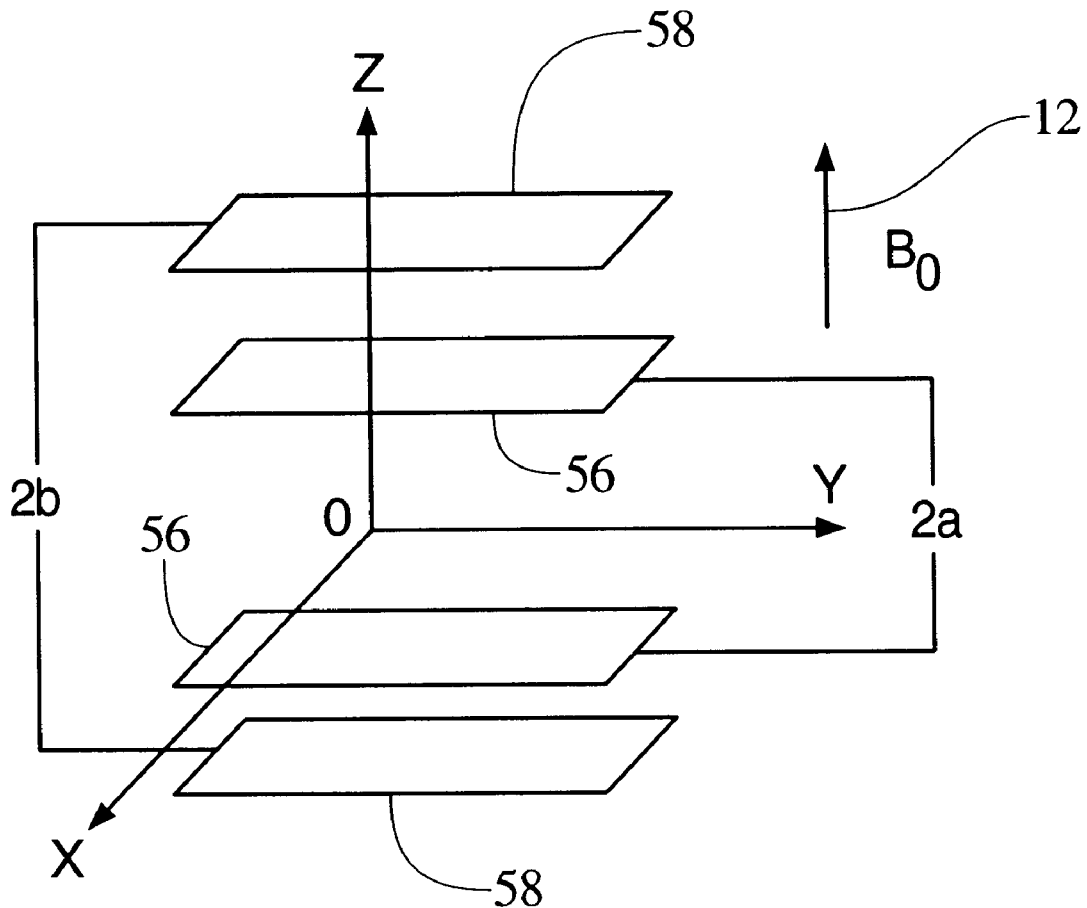
FIG. 2 illustrates the geometrical configuration of the shielded thrust balanced bi-planar gradient coil of the present invention.

The geometrical configuration of a shielded bi-planar gradient coil assembly is shown in FIG. 2. The gap between the two planes of the primary windings is denoted as 2$a$, while the gap between the planes of the secondary windings is denoted as 2$b$. The direction of the main magnetic field, $\vec{B}_0$, is considered to be along the $\hat{z}$ axis. The interaction between the current density, $J(x, y)^{(\pm a, \pm b)} = [J_x(x,y)^{(\pm a, \pm b)}\hat{x} + J_y(x,y)^{(\pm a, \pm b)}\hat{y}]$, of each one of the three (X, Y, and Z) gradient coils with the axial and transverse components of the main magnetic filed, $\vec{B}_0$, generates a net thrust force, F, along the x, y, and z direction, respectively, which has the form:

$$F_x^{(\pm a, \pm b)} = \iint_{-\infty}^{+\infty} J_y^{(\pm a, \pm b)} B_{0z}^{(\pm a, \pm b)}(x, y) dx dy \qquad (1)$$

$$F_y^{(\pm a, \pm b)} = \iint_{-\infty}^{+\infty} J_x^{(\pm a, \pm b)} B_{0z}^{(\pm a, \pm b)}(x, y) dx dy \qquad (2)$$

$$F_z^{(\pm a, \pm b)} = \iint_{-\infty}^{+\infty} \left( J_x^{(\pm a, \pm b)} B_{0y}^{(\pm a, \pm b)}(x, y) - J_y^{(\pm a, \pm b)} B_{0x}^{(\pm a, \pm b)}(x, y) \right) dx dy. \qquad (3)$$

In light of the behavior of the current density for the three gradient coils, the expression of the magnet fields for the Z, Y, and X-gradients, respectively, are for $|z| \leq a$:

$$B_z = -\frac{\mu_0}{4\pi^2} \int_{-\infty}^{+\infty} \int_{-\infty}^{+\infty} \frac{d\alpha d\beta}{\beta} \sqrt{\alpha^2 + \beta^2} \cos(\alpha x)\cos(\beta y)\sinh\left(\sqrt{\alpha^2 + \beta^2}\, z\right) J_x^a(\alpha, \beta) e^{-a\sqrt{\alpha^2+\beta^2}} \left[1 - e^{-2(b-a)\sqrt{\alpha^2-\beta^2}}\right] \qquad (4)$$

$$B_z = -\frac{\mu_0}{4\pi^2} \int_{-\infty}^{+\infty} \int_{-\infty}^{+\infty} \frac{d\alpha d\beta}{\beta} \sqrt{\alpha^2 + \beta^2} \cos(\alpha x)\sin(\beta y)\cosh\left(\sqrt{\alpha^2 + \beta^2}\, z\right) J_x^a(\alpha, \beta) e^{-a\sqrt{\alpha^2+\beta^2}} \left[1 - e^{-2(b-a)\sqrt{\alpha^2+\beta^2}}\right] \qquad (5)$$

$$B_z = -\frac{\mu_0}{4\pi^2} \int_{-\infty}^{+\infty} \int_{-\infty}^{+\infty} \frac{d\alpha d\beta}{\beta} \sqrt{\alpha^2 + \beta^2} \sin(\alpha x)\cos(\beta y)\cosh\left(\sqrt{\alpha^2 + \beta^2}\, z\right) J_x^a(\alpha, \beta) e^{-a\sqrt{\alpha^2+\beta^2}} \left[1 - e^{-2(b-a)\sqrt{\alpha^2+\beta^2}}\right], \qquad (6)$$

where $J(\alpha, \beta)$ are spatial Fourier transforms of $J(x,y)$. The expressions for the stored magnetic energy of the three gradient coils are:

$$W_m = \frac{\mu_0}{8\pi^2} \int_{-\infty}^{+\infty} \int_{-\infty}^{+\infty} \frac{d\alpha d\beta}{\beta^2} \sqrt{\alpha^2 + \beta^2}\, (J_x^a)^2 \left[1 - e^{-2a\sqrt{\alpha^2+\beta^2}}\right]\left[1 - e^{-2(b-a)\sqrt{\alpha^2+\beta^2}}\right] \qquad (7)$$

for the Z-gradient, and:

$$W_m = \frac{\mu_0}{8\pi^2} \int_{-\infty}^{+\infty} \int_{-\infty}^{+\infty} \frac{d\alpha d\beta}{\beta^2} \sqrt{\alpha^2 + \beta^2}\, (J_x^a)^2 \left[1 + e^{-2a\sqrt{\alpha^2+\beta^2}}\right]\left[1 - e^{-2(b-a)\sqrt{\alpha^2+\beta^2}}\right] \qquad (8)$$

for the X and Y-gradients.

Employing the energy minimization technique, the functional ∈ (J) in terms of the magnetic field and the stored magnetic energy, $W_m$, is constructed as:

$$\xi(J) = W_m - \sum_{j=1}^{N} \lambda_j \left( B_z(\vec{r}_j) - B_{zSC} \right), \quad (9)$$

where $B_{zSC}$ are the constraint values of the magnetic field at the constraint points $\vec{r}_j$ and $\lambda_j$ are the Lagrange multipliers. Minimizing ∈, we obtain continuous current density distributions for either the axial Z or the transverse X, Y-gradient coils. The discrete current patterns for the axial and the transverse gradients are then generated by applying the stream function technique to their continuous current distributions.

Based on the discrete current patterns, the net thrust forces (generally non-zero) for each coil from equations (1), (2), and (3) are calculated. Discrete data points are used to represent $B_{0y}^{(\pm a, \pm b)}(x, y)$ over each gradient coil. Using the discrete version of the current for the X, Y, and Z-gradient coils, as well as the discrete form for the main field in the (x,y) plane, equations (1), (2), and (3) take the form, respectively:

$$F_x^{(a,b)} = 8 \sum_n I_n^{(a,b)} \frac{\Delta y_n}{\Delta x_n \sqrt{\Delta x_n^2 + \Delta y_n^2}} \sum_i B_{0z}^{(a,b)}(x_i, y_i) \Delta x_i \Delta y_i \quad (10)$$

$$F_y^{(a,b)} = -8 \sum_n I_n^{(a,b)} \frac{\Delta x_n}{\Delta y_n \sqrt{\Delta x_n^2 + \Delta y_n^2}} \sum_i B_{0z}^{(a,b)}(x_i, y_i) \Delta x_i \Delta y_i \quad (11)$$

$$F_z^{(a,b)} = -8 \sum_n I_n^{(a,b)} \sum_i \left[ \frac{\left(\frac{\Delta x_n}{\Delta y_n}\right) B_{0y}^{(a,b)} - \left(\frac{\Delta y_n}{\Delta x_n}\right) B_{0x}^{(a,b)}}{\sqrt{\Delta x_n^2 + \Delta y_n^2}} \right] \Delta x_i y_i. \quad (12)$$

In order to obtain a zero net thrust force, the return paths of the secondary or shielding coil's 58 end loops are spatially displaced in the (x,y) plane. The Biot-Savart law is then applied to the modified discrete current distribution in order to estimate the strength, the uniformity, and the linearity of the gradient field and its shielding characteristics.

Figure 3A:
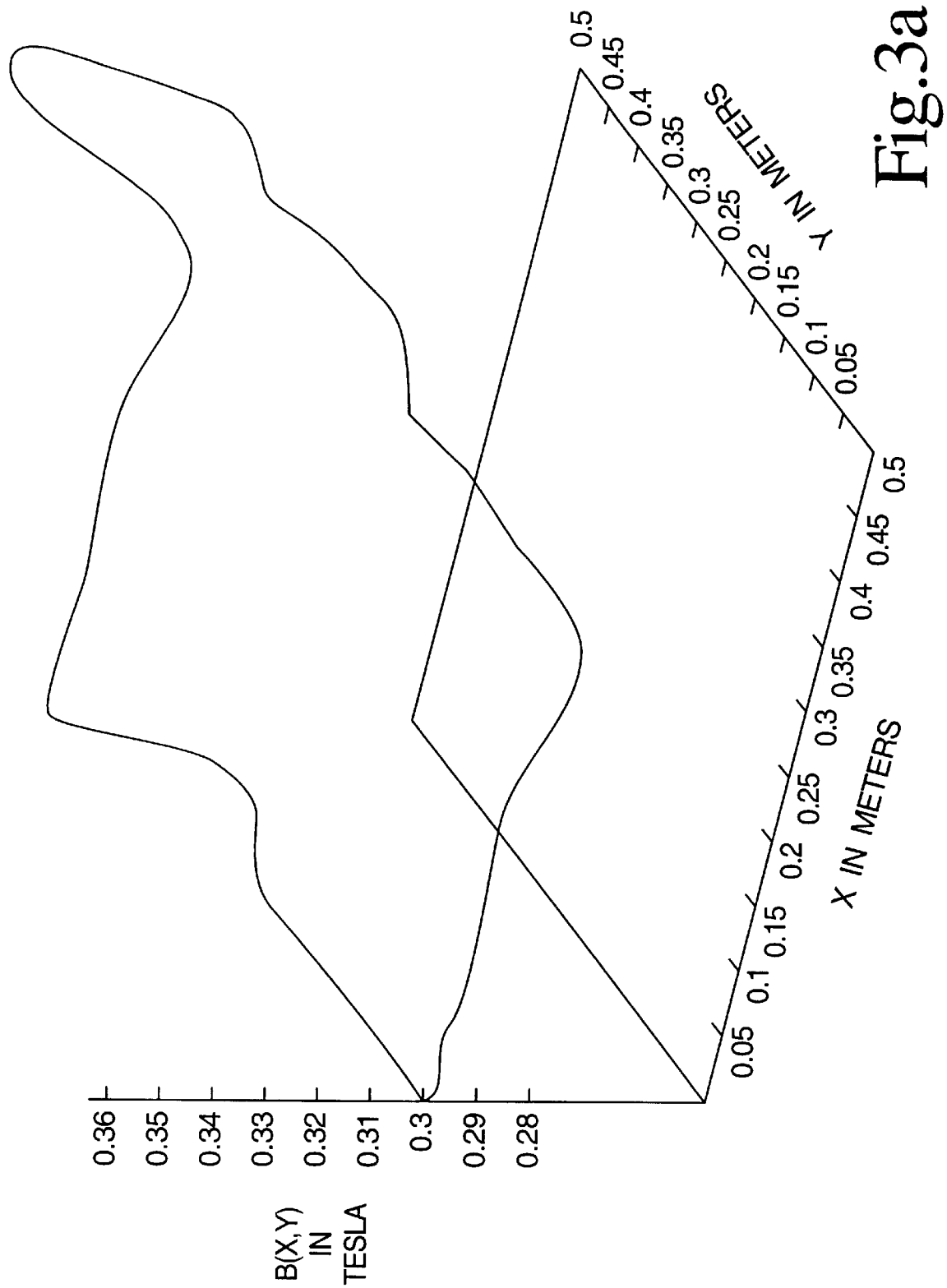
FIGS. 3a and 3b illustrate the spatial variation of the main magnetic field in the vicinity of the primary and secondary windings.
Figure 3B:
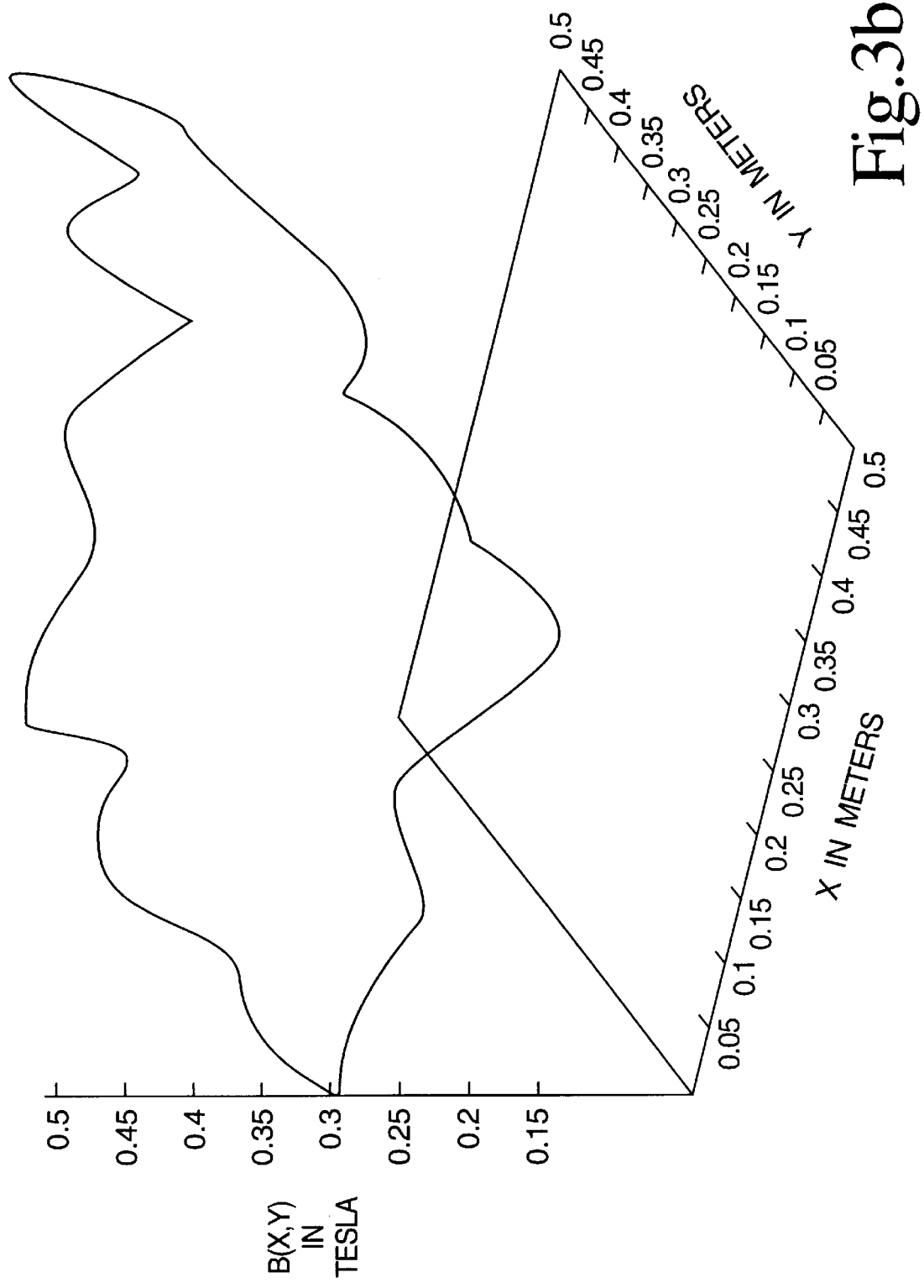

In one preferred embodiment, a transverse or Y shielded bi-planar thrust balance gradient coil assembly is arranged such that the distances between the two planes of the primary windings 56 and the secondary windings 58 are chosen to be 2a=0.470 m and 2b=0.546 m, respectively. Furthermore, the strength of the main magnetic field 12 which is employed is 0.3 T with a 40 ppm inhomogeneity inside a 40 cm DSV (Diameter Spherical Volume). FIGS. 3*a* and 3*b* show the spatial variation of the main field 12 in the vicinity of the primary windings 56 and secondary windings 58 locations, respectively. Three constraint points are employed to generate a 23.4 mT/m gradient strength, with 13% on-axis linearity and 15% off-axis uniformity at the borders of the 40 cm DSV.

Figure 4A:
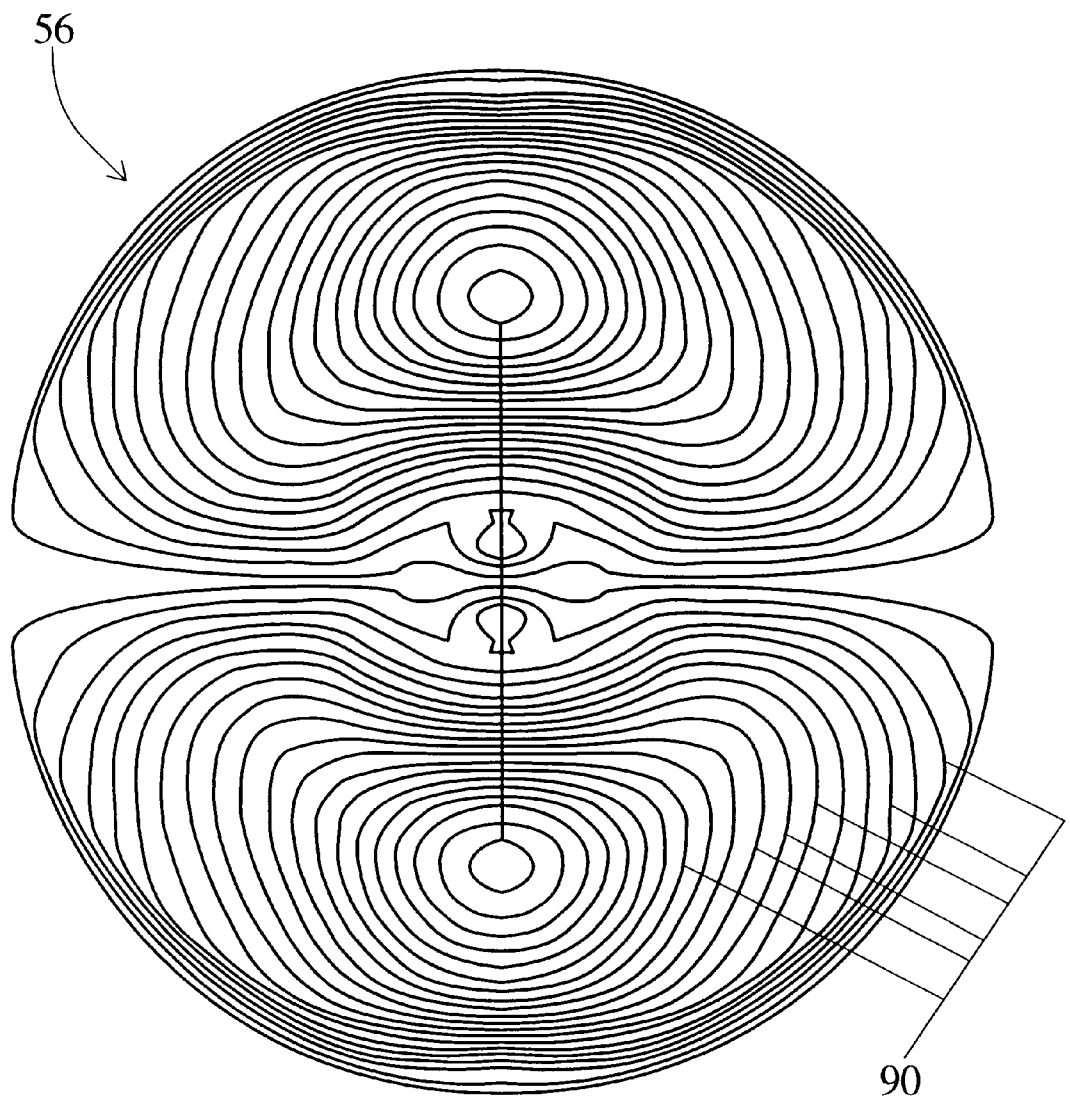
FIGS. 4a and 4b illustrate primary and secondary windings, respectively, for Y gradient production in accordance with the present invention.
Figure 4B:
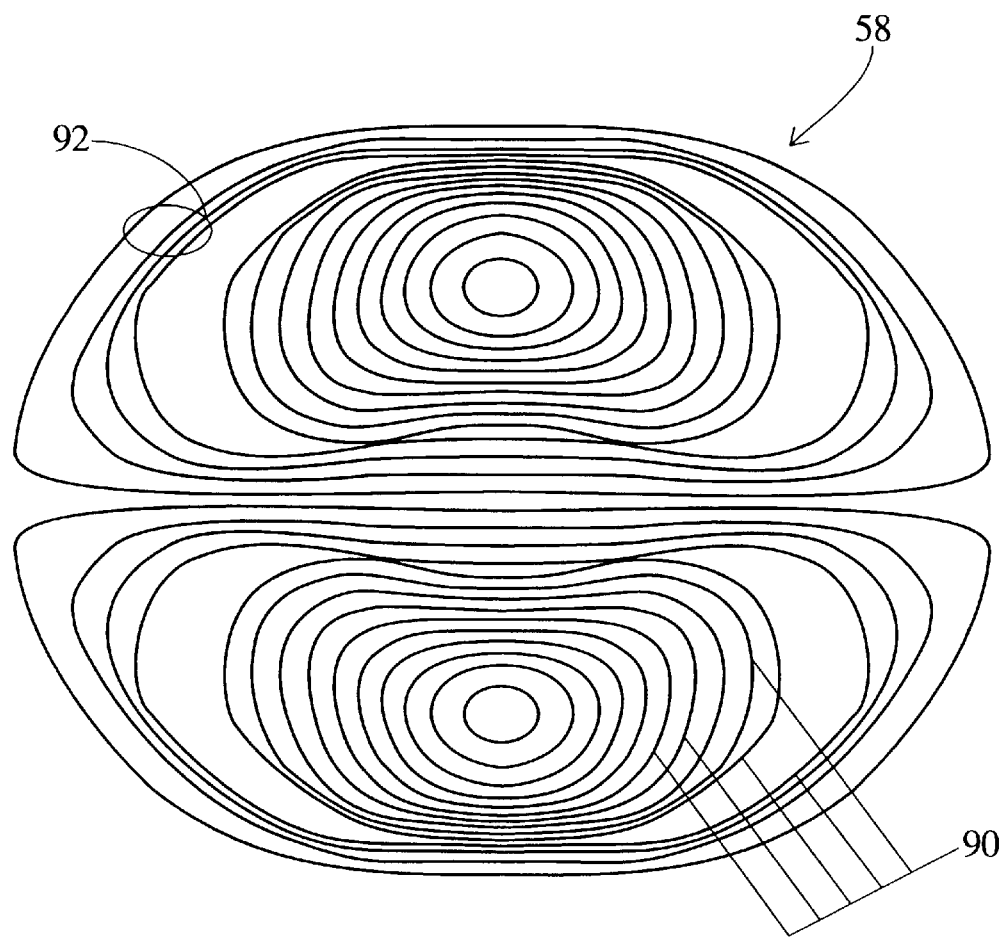
Figure 5:
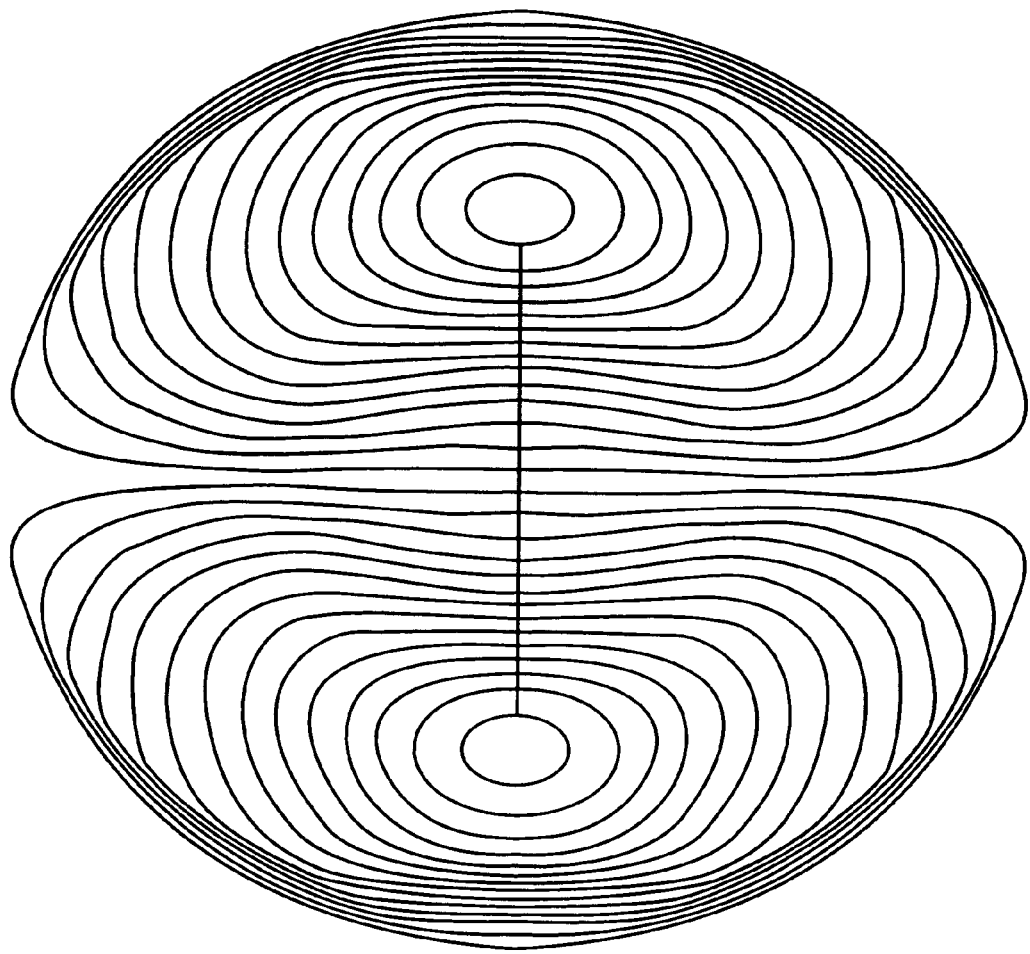
FIG. 5 illustrates a secondary winding for Y gradient production in accordance with non-thrust balanced bi-planar gradient coil assemblies.
Figure 6:
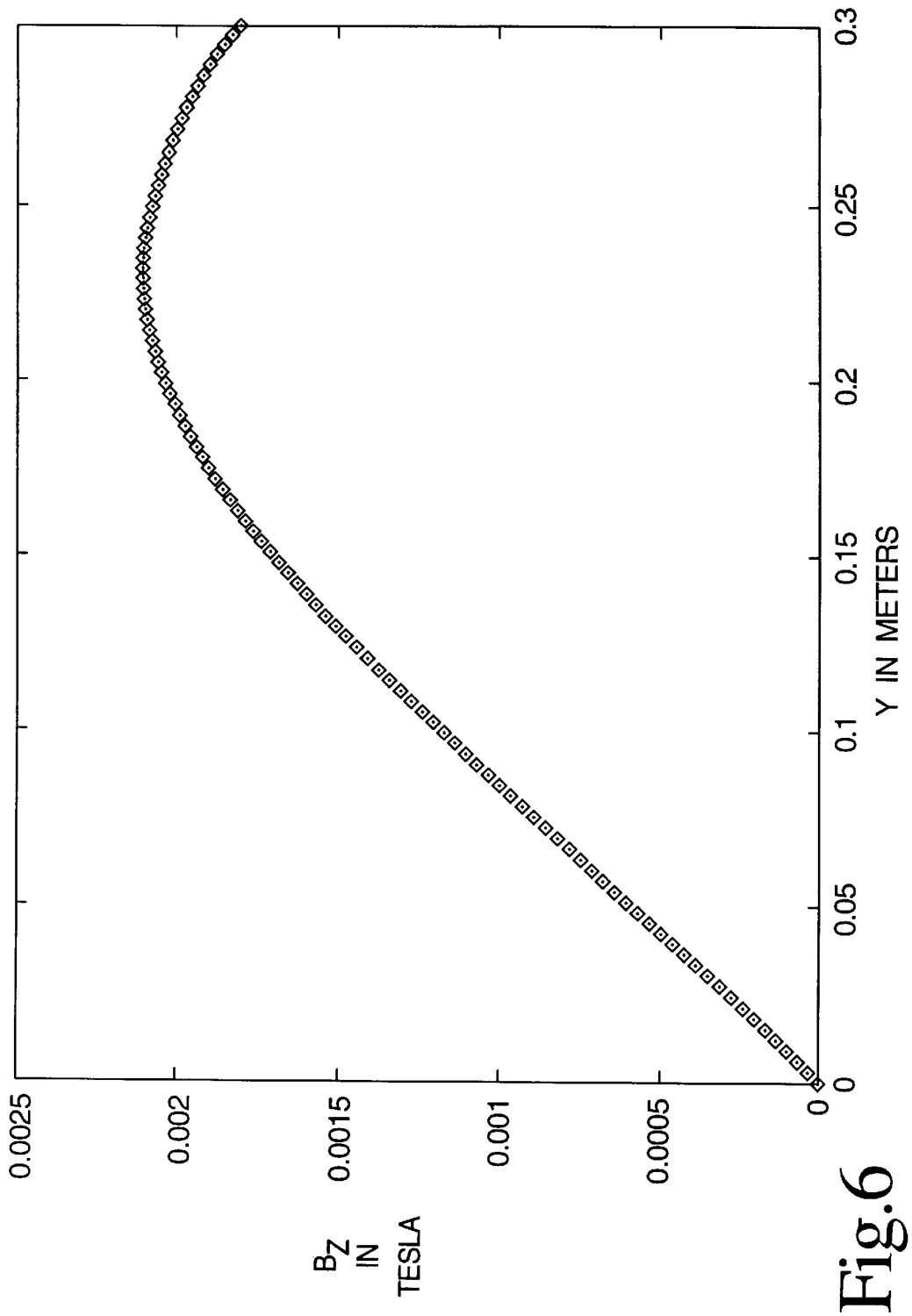
FIG. 6 illustrates on-axis behavior with net thrust forces.
Figure 7:
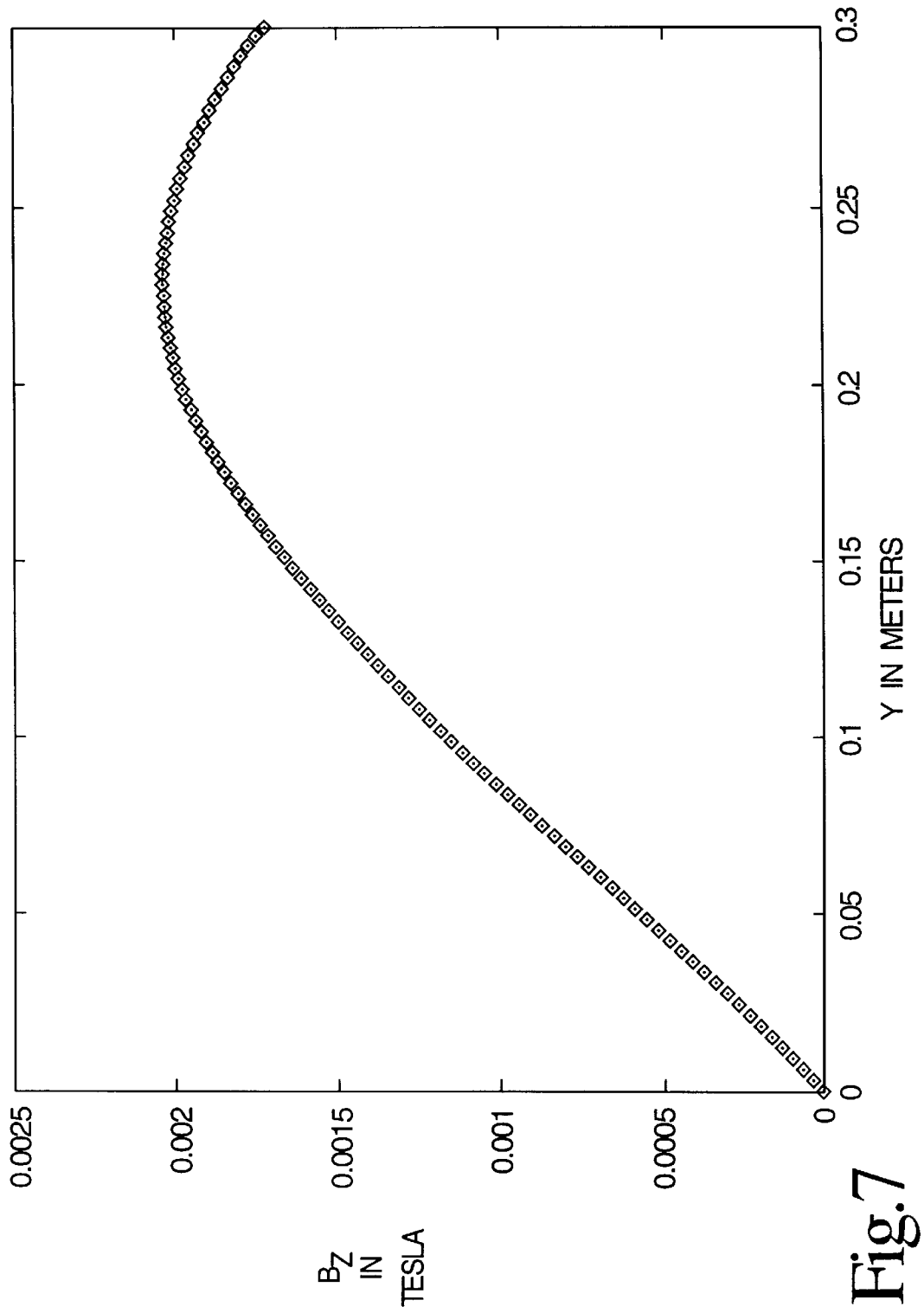
FIG. 7 shows the on-axis behavior with thrust balance forces in accordance with the present invention.
Figure 8:
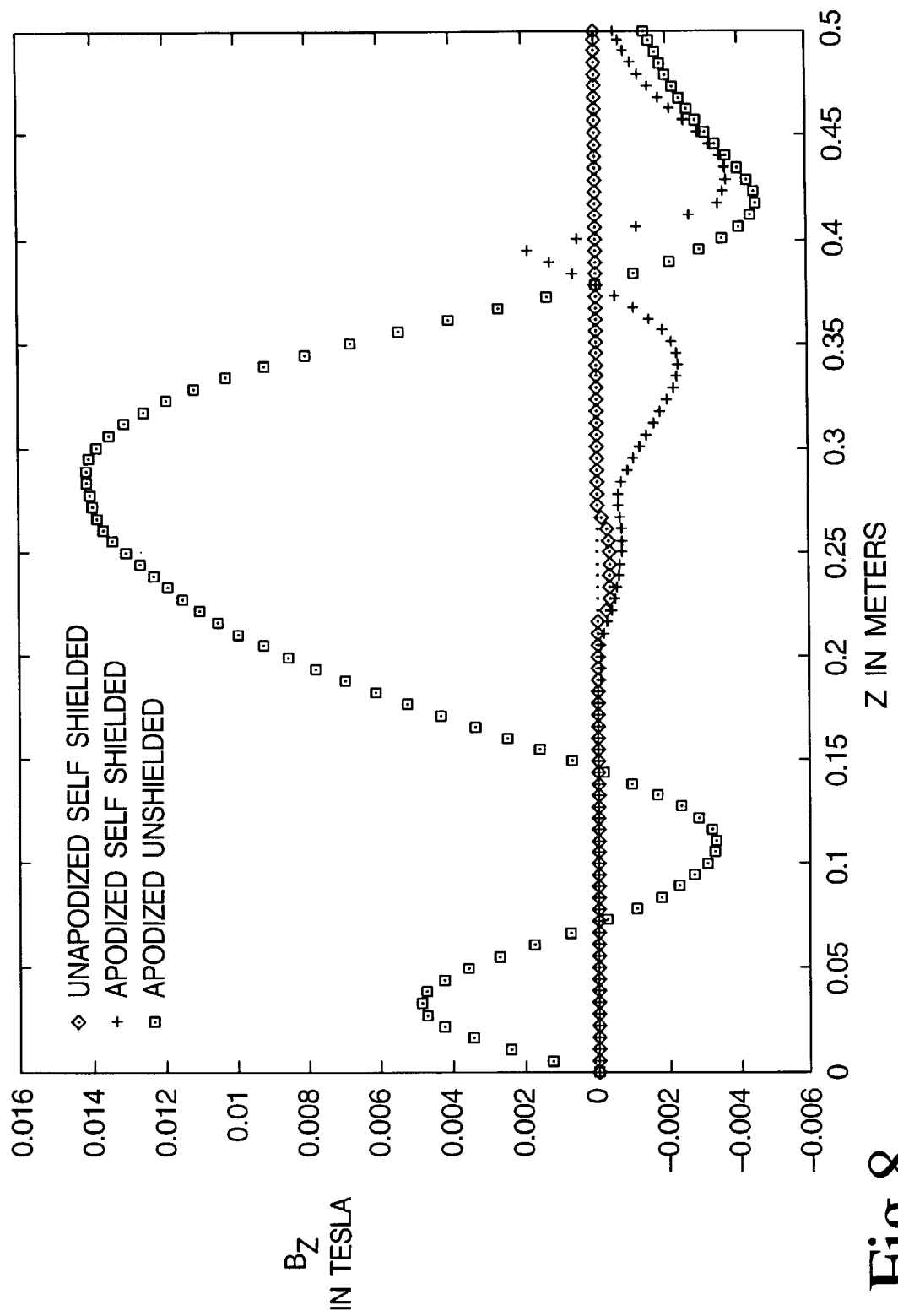
FIG. 8 illustrates the shielding behavior of gradient coil assembly in accordance with the present invention.

Employing the target field approach in conjunction with the stream function technique, the discrete current patterns for primary windings (FIG. 4*a*) and secondary windings (FIG. 5) of a shielded bi-planar Y-gradient coil are generated. From the Biot-Savart law, the on-axis behavior for the shielded bi-planar Y-gradient coil (FIG. 6) is calculated. In addition, from the interaction between the main magnetic field 12 and the discrete current loops of both the primary and secondary windings 56, 58, the resultant net thrust force is $F_{ynet}$=−908 N. By spatially moving the last 4 end loops 92 of the secondary winding 58 as shown in FIG. 4*b*, the value of the net thrust force is reduced to $F_{ynet}$=−0.065 N. Again, applying the Biot-Savart law to the modified current pattern of the secondary windings 58, the gradient strength is 23.0 mT/m (FIG. 7), while no significant changes on the shielding behavior of the gradient coil assembly 50 was observed (FIG. 8). Table 1 shows a comparison of all the relevant characteristics between the conventional shielded non-thrust balanced and the shielded thrust-balanced bi-planar Y-gradient coils, when both are driven with a 400 A/400 V amplifier.

TABLE 1

|  | Zero Thrust Coil | Conventional Coil |
|---|---|---|
| GRAD. Stren. | 23.0 mT/m | 23.4 mT/m |
| Induc. | 208 μH | 203 μH |
| Rise Time | 232 μsec | 226 μsec |
| SLEW RATE | 99 T/m/sec | 103.5 T/m/sec |
| Thrust Force A coil | −1817.1432 N | −1817.1432 N |
| Thrust Force B Coil | 1817.078 N | 909.3546 N |
| Net Thrust Force | −0.065 N | −908 N |

Figure 9A:
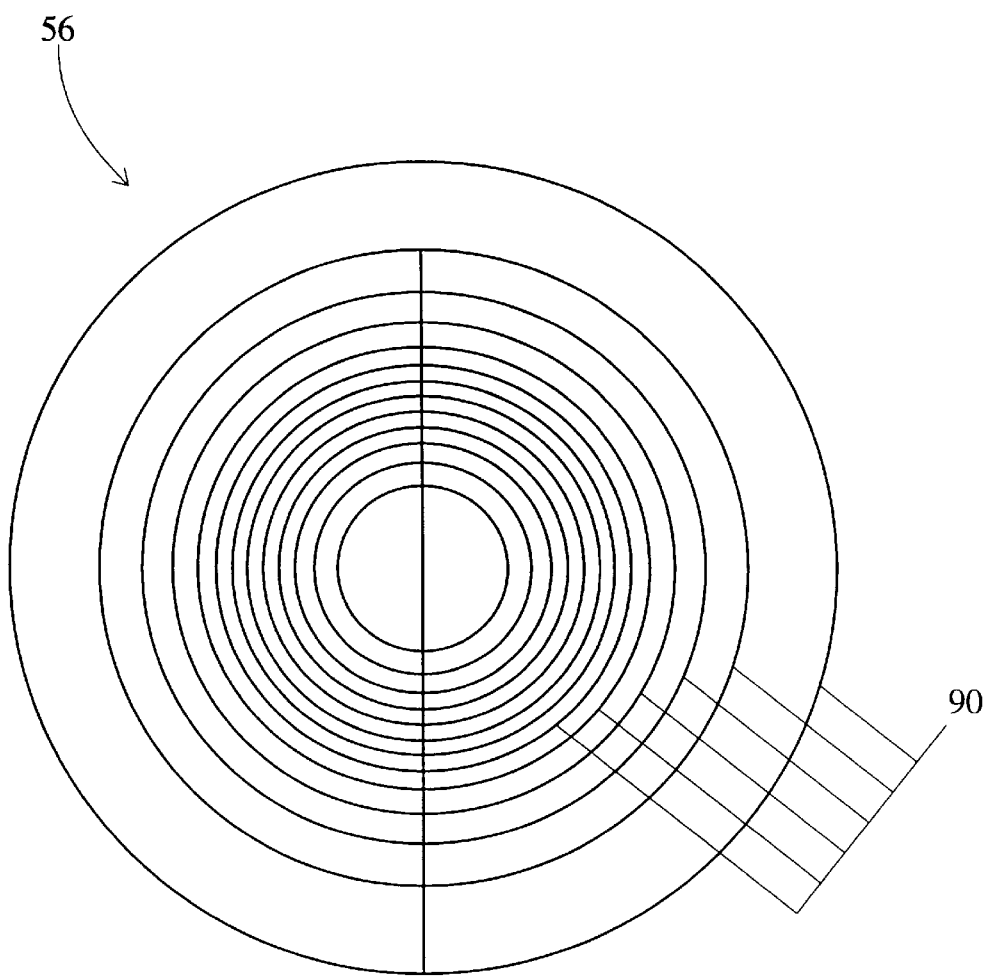
FIGS. 9a and 9b illustrate primary and secondary windings, respectively, for Z gradient production in accordance with the present invention; and, FIG. 10 illustrates a secondary winding for Z gradient production in accordance with non-thrust balanced bi-planar gradient coil assemblies.
Figure 9B:
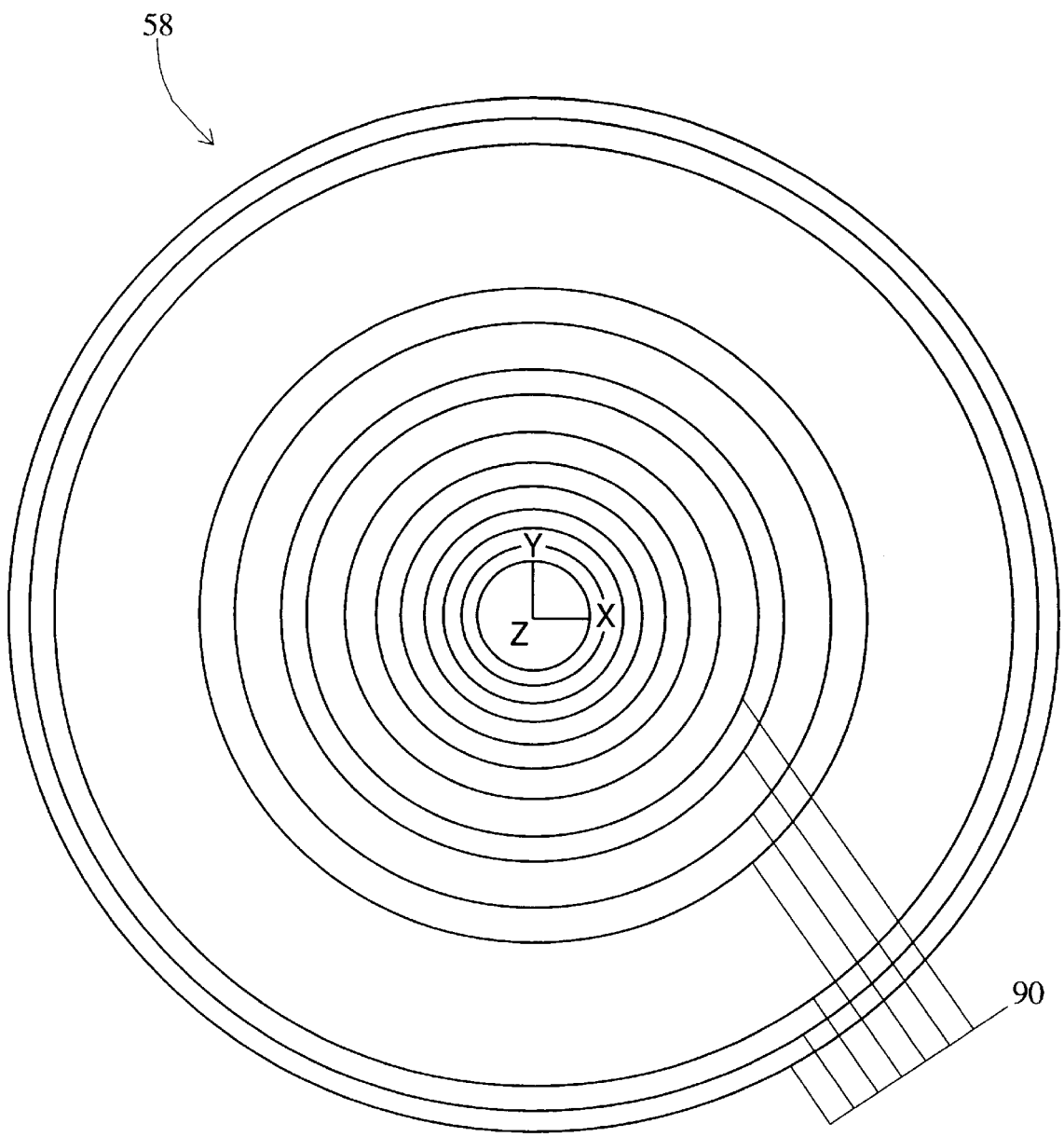
Figure 10:
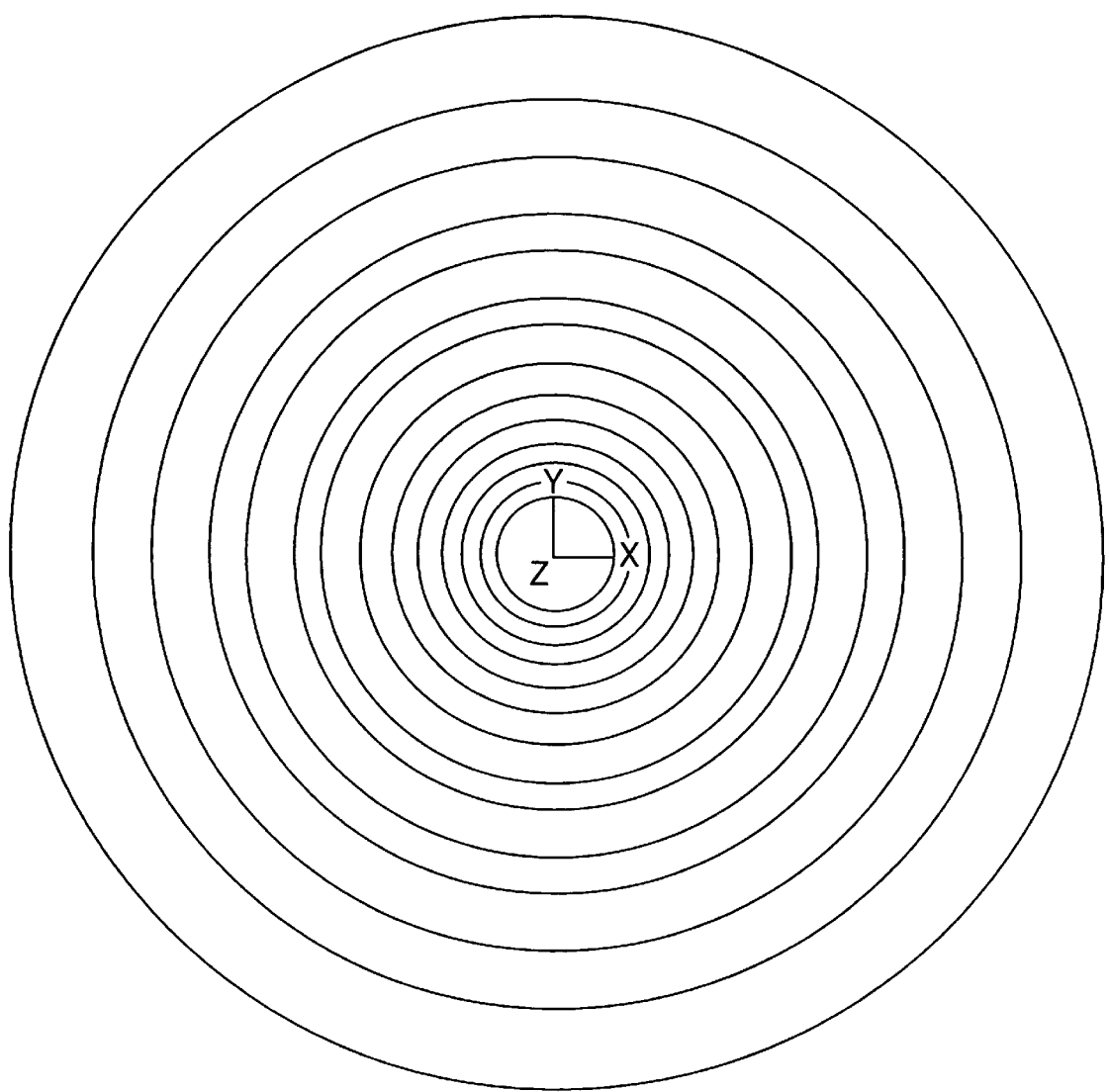

The X-gradient coil analysis is similar to the Y, since the current patterns are generally the same rotated by 90° about the z axis. The Z-gradient coil also receives similar analysis. FIGS. 9*a* and 9*b* show the arrangement of the coil loop arrays 90 for the primary and secondary windings 56, 58, respectively. For comparison, FIG. 10 shows the secondary or shielding winding prior to being modified, by displacement of the outer loops, for thrust balancing.

While the preferred embodiment has been described as including secondary or shielding windings 58, it is to be appreciated that the secondary or shielding windings 58 may not be employed. In this case, the primary windings 56 are spatially displaced in the (x,y) plane to balance the thrust forces. As well, not withstanding the fact that the preferred embodiment has been described in terms of primary and secondary windings 56, 58, it is to be appreciated that rather than arranging the secondary or shielding windings 58 to balance the net thrust forces, additional windings may be added to either the primary or secondary windings 56, 58, respectively, which act to balance the net thrust force on the set of windings 52, 54. Further, rather than spatially displacing the coil loops in the secondary or shielding winding 58, the coil loops in the primary windings 56 may be spatially displaced in the (x,y) plane. Another alternative is to place additional windings on a flared portion of the secondary windings such that a current density on the outward flared portion balances the net thrust forces to zero.

Although the above described method calculates an ideal current distribution, the force correcting current for canceling the net thrust force acting on each set of windings 52, 54 can be determined iteratively. Specifically, several coil loops are disposed at the ends of one of the primary and secondary windings 56, 58, preferably the secondary windings 58. The net thrust force each set of windings 52, 54 drawing a gradient current pulse is measured. The current flow through the force correcting windings (or a number of force correcting loops) is iteratively adjusted until the net thrust forces are substantially zeroed.

The invention has been described with reference to the preferred embodiment. Obviously, modifications and alterations will occur to others upon reading and understanding the proceeding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging apparatus comprising:
   a main magnet having opposite first and second poles arranged facing one another to define a subject receiving region therebetween which generates a substantially uniform main magnetic field within the subject receiving region, the substantially uniform main magnetic field having non-uniformities and radial components at a periphery of the subject receiving region;
   a radio frequency coil disposed adjacent the subject receiving region, positioned to transmit radio frequency signals into the subject receiving region and receive radio frequency signals therefrom; and
   a shielded thrust balanced bi-planar gradient coil assembly including at least one pair of windings for generating substantially linear magnetic gradients across the subject receiving region, each pair of windings including:
     a first set of windings carrying electrical current pulses having at least a primary winding and a secondary winding positioned on one side of the subject receiving region adjacent the first pole with the secondary winding closer to the first pole than the primary winding, the first set of windings being arranged such that net thrust forces acting on the first set of windings generated by the interaction between the main magnetic field and the electrical current pulses are substantially zero; and,
     a second set of windings carrying electrical current pulses having at least a primary winding and a secondary winding positioned on a side of the subject receiving region opposite the first set of windings adjacent the second pole with the secondary winding closer to the second pole than the primary winding, the second set of windings being arranged such that net thrust forces acting on the second set of windings generated by the interaction between the main magnetic field and the electrical current pulses are substantially zero.

2. The magnetic resonance imaging apparatus of claim 1, further including:
   a current supply for supplying the electrical current pulses to the windings;
   a radio frequency transmitter for supplying radio frequency signals to the radio frequency coil;
   a radio frequency receiver for receiving radio frequency signals from the radio frequency coil;
   a reconstruction processor for reconstructing an image representation from the signals received by the radio frequency receiver; and,
   a human viewable display for displaying the image representation.

3. The magnetic resonance imaging apparatus of claim 1, wherein the shielded thrust balanced bi-planar gradient coil assembly includes three pairs of windings one each for generating a substantially linear magnetic gradient across the subject receiving region along three mutually orthogonal axes x, y, and z, the z axis aligned with the main magnetic field and the x and y axes positioned in a plane transverse thereto.

4. The magnetic resonance imaging apparatus of claim 3, wherein the pair of windings for generating the substantially linear magnetic gradient along the x axis is substantially the same as the pair of windings for generating the substantially linear magnetic gradient along the y axis rotated 90 degrees about the z axis.

5. The magnetic resonance imaging apparatus of claim 1, wherein a magnetic flux density in a region outside an area defined by the secondary windings is substantially canceled.

6. The magnetic resonance imaging apparatus of claim 1, wherein the primary windings are arranged to induce the substantially linear magnetic gradients, and the secondary windings are arranged to substantially cancel a magnetic flux density in a region outside an area defined by the secondary windings while balancing the net thrust forces acting on the set of windings to substantially zero.

7. The magnetic resonance imaging apparatus of claim 1, wherein each set of windings further includes:
   force balancing windings, and wherein the primary windings are arranged to induce the substantially linear magnetic gradients, the secondary windings are arranged to substantially cancel a magnetic flux density in a region outside an area defined by the secondary windings, and the force balancing windings are arranged to substantially zero the net thrust forces acting on the sets of windings.

8. The magnetic resonance imaging apparatus of claim 1, wherein an absolute value of the net thrust forces acting on the sets of windings is less than 20 Newtons.

9. The magnetic resonance imaging apparatus of claim 1, wherein the poles are connected by a ferrous flux return path.

10. A method of producing a magnetic resonance image comprising:
    (a) arranging two opposite poles of a main magnet facing one another to define an examination region therebetween;
    (b) generating a substantially uniform main magnetic field in the examination region having non-uniformities and radial components at a periphery of the examination region;
    (c) generating substantially linear magnetic gradients across the examination region by applying electrical current pulses to primary windings positioned on opposite sides of the examination region by the poles of the main magnet; and,
    (d) applying electrical current pulses to secondary windings positioned outside the primary windings adjacent the poles of the main magnet thereby substantially canceling a magnetic flux density outside a region defined by the secondary windings while balancing to substantially zero a net thrust force on each pair of primary and secondary windings caused by the interaction of the main magnetic field and the electrical current pulses.

11. The method of claim 10, further including the step of connecting the opposite poles of the main magnet with a ferrous flux return path.

12. In a magnetic resonance imaging apparatus having an open magnet with opposite first and second poles arranged facing one another to define a subject receiving region therebetween which generates a main magnetic field within the subject receiving region, the main magnetic field having non-uniformities and radial components at a periphery of the subject receiving region, a gradient coil assembly for generating substantially linear magnetic gradients across the subject receiving region, a current supply for selectively supplying electrical current pulses to the gradient coil assembly, a radio frequency coil disposed about the subject receiving region positioned to transmit radio frequency signals into the subject receiving region and receive radio frequency signals therefrom, a transmitter for supplying radio frequency signals to the radio frequency coil, a receiver for receiving radio frequency signals via the radio frequency coil, and a reconstruction processor for reconstructing an image representation from the signals received by the radio frequency receiver to display on a human viewable display, the gradient coil assembly comprising:

at least one shielded thrust balanced bi-planar gradient coil, each shielded thrust balanced bi-planar gradient coil having:

a first set of windings having at least a primary winding and a secondary winding positioned on one side of the subject receiving region adjacent the first pole with the secondary winding closer to the first pole than the primary winding, the first set of windings being arranged such that net thrust forces acting on the first set of windings generated by the interaction between the main magnetic field and the electrical current pulses are substantially zero; and, a second set of windings having at least a primary winding and a secondary winding positioned on a side of the subject receiving region opposite the first set of windings adjacent the second pole with the secondary winding closer to the second pole than the primary winding, the second set of windings being arranged such that net thrust forces acting on the second set of windings generated by the interaction between the main magnetic field and the electrical current pulses are substantially zero.

13. The gradient coil assembly of claim 12, wherein a current density in the secondary windings is higher around a periphery of the secondary windings than toward a center of the secondary windings.

14. The gradient coil assembly of claim 12, wherein a periphery of the secondary windings are flared outward and a current density on the flared portion of the secondary windings balances the net thrust forces acting on each set of windings to zero.

\* \* \* \* \*